United States Patent
Chen

(10) Patent No.: US 6,205,025 B1
(45) Date of Patent: Mar. 20, 2001

(54) HEAT SINK STRUCTURE ADAPTED FOR USE IN A COMPUTER

(76) Inventor: Yang-Shiau Chen, 10FL, No. 406, Sec. 4, Jen Ai Rd., Taipei (TW)

( * ) Notice: Subject to any disclaimer, the term of this patent is extended or adjusted under 35 U.S.C. 154(b) by 0 days.

(21) Appl. No.: 09/493,204

(22) Filed: Jan. 28, 2000

(51) Int. Cl.[7] ................................................. H05K 7/20
(52) U.S. Cl. .................... 361/704; 361/687; 361/688; 361/690; 361/695; 361/719; 361/720; 174/15.1; 174/15.2; 174/16.1; 174/16.3; 165/80.3; 165/80.4; 312/223.2
(58) Field of Search .................... 361/687–690, 361/694, 695, 698–701, 704, 707, 714, 720; 174/15.1, 15.2, 16.1, 16.3; 165/80.2, 80.3, 80.4, 185; 312/223.2

(56) References Cited

U.S. PATENT DOCUMENTS

| | | | |
|---|---|---|---|
| 5,712,762 | * | 1/1998 | Webb ................................. 361/687 |
| 5,949,648 | * | 9/1999 | Liao .................................. 361/700 |
| 5,969,940 | * | 10/1999 | Sano et al. ........................ 361/687 |
| 5,973,920 | * | 10/1999 | Altic et al. ....................... 361/687 |
| 6,043,977 | * | 3/2000 | Nakajima ......................... 361/687 |
| 6,049,455 | * | 4/2000 | Nakamura et al. ............... 361/688 |

* cited by examiner

*Primary Examiner*—Leo P. Picard
*Assistant Examiner*—Boris L. Chervinsky
(74) *Attorney, Agent, or Firm*—Bacon & Thomas, PLLC

(57) ABSTRACT

A heat sink structure adapted for use in a computer housing includes a thin plate of metal mounted on an inner side of a light plastic computer housing. A clearance is confined between the plate and the computer housing. The plate is connected to a main board disposed above. A heat sink element of a central processing unit on the main board has at least one heat pipe connected to the plate to dissipate heat in the computer housing via the plate. The computer housing is further provided with a fan to guide hot air out. The plate is formed with air vents to enhance air circulation or is provided with ribs to enhance heat dissipation. The plate is preferably formed from copper or aluminum that has good heat conductivity.

9 Claims, 5 Drawing Sheets

HEAT SINK STRUCTURE ADAPTED FOR USE IN A COMPUTER

BACKGROUND OF THE INVENTION (a) Field of the Invention

The present invention relates to a heat sink structure in a computer housing, more particularly to a heat sink of a low profile and having good heat dissipation effect.

(b) Description of the Prior Art

Conventional heat sinks are mostly directed to dissipating the heat of the central processing units. The central processing unit is generally provided with a fan as well as cooling fins to ensure that it operates at a relatively low temperature to maintain proper operation of the computer. However, the combination of fan and cooling fans has a considerably high profile, which is not advantageous especially for portable computers. There have been numerous attempts to provide low-profile heat sinks for portable computers, and the problem is yet to be solved. Housings having a better heat dissipation effect are formed from aluminum magnesium alloys, which can dissipate heat quick and prevent electromagnetic interference. However, the overall weight of aluminum magnesium housing is heavy, and the cost is quite uneconomical. Besides, it is not very comfortable to use or convenient to carry a computer with a metal housing.

SUMMARY OF THE INVENTION

A primary object of the present invention is to provide a heat sink structure adapted for use in a computer housing, in which a large-area thin metal plate is mounted in a computer housing to increase heat dissipating efficiency. The plate does not add much weight to the computer housing and does not occupy space. Besides, the plate is easy and inexpensive to manufacture, and can be adapted for use in different models of computer housing to dissipate the heat generated by all the components in the computer housing. Furthermore, the plate can better prevent electromagnetic interference.

According to the present invention, a heat sink structure adapted for use in a computer housing includes a thin plate of metal mounted on an inner side of a light plastic computer housing. A clearance is confined between the plate and the computer housing. The plate is connected to a main board disposed above. A heat sink element of a central processing unit on the main board has at least one heat pipe connected to the plate to dissipate heat in the computer housing via the plate. The computer housing is further provided with a fan to guide hot air out. The plate is formed with air vents to enhance air circulation or is provided with ribs to enhance heat dissipation. The plate is preferably formed from copper or aluminum that has good heat conductivity.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
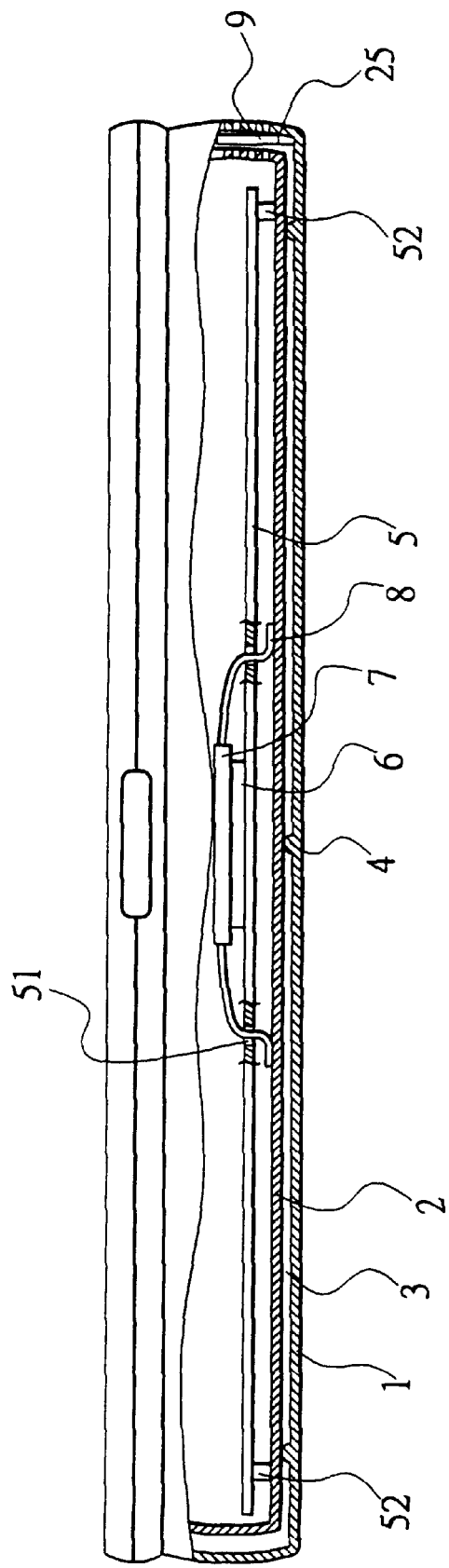
FIG. 1 is a sectional view of the first preferred embodiment of the present invention.
Figure 2:
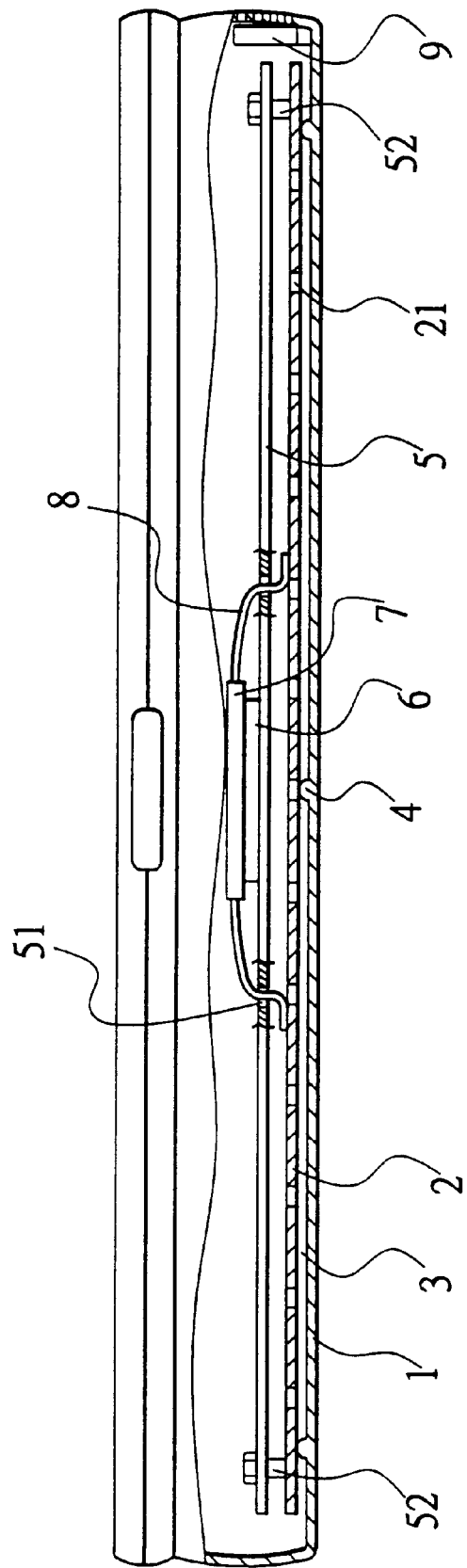
FIG. 2 is a sectional view of the second preferred embodiment of the present invention.
Figure 3:
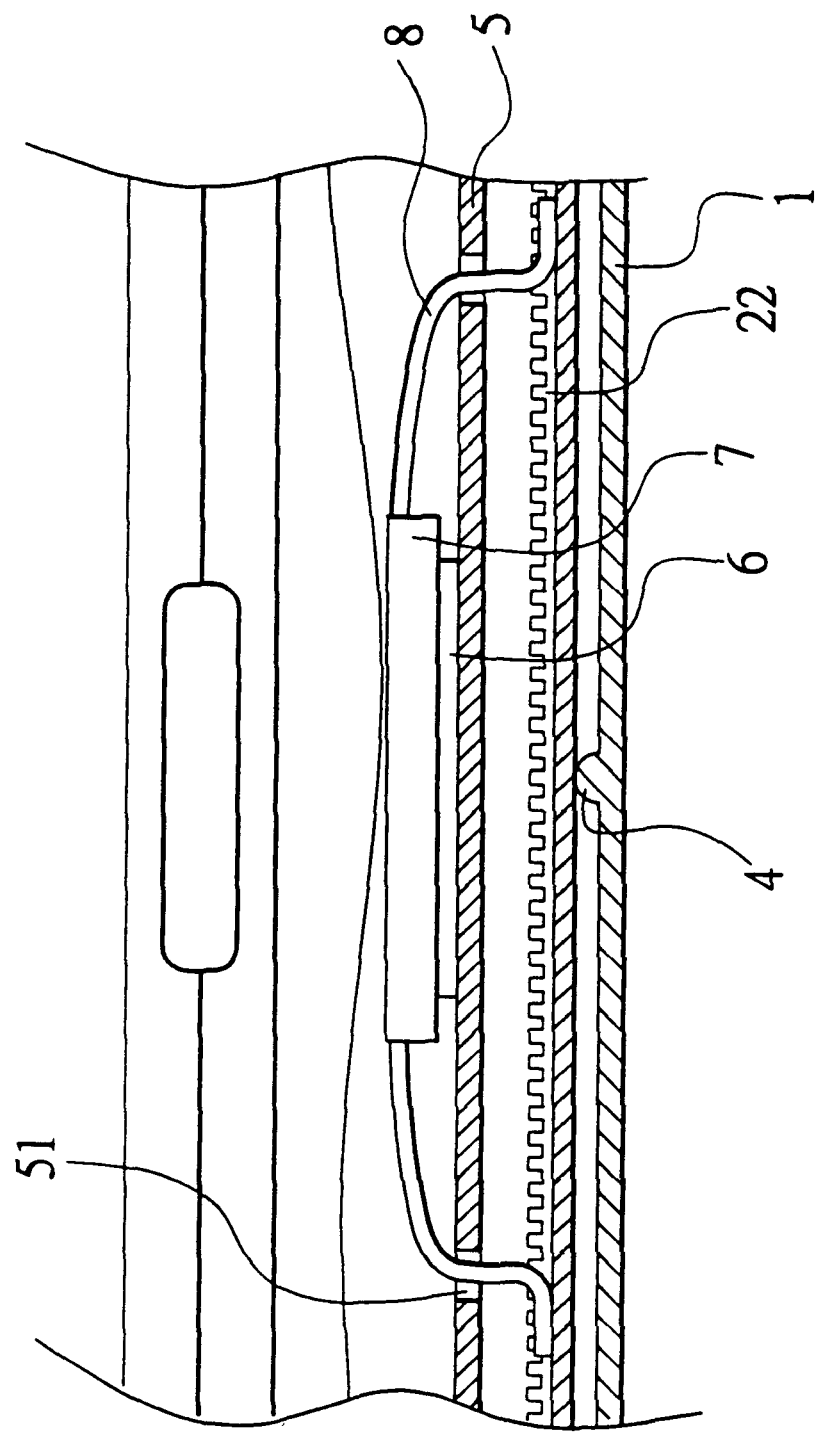
FIG. 3 is a sectional view of the third preferred embodiment of the present invention.
Figure 4:
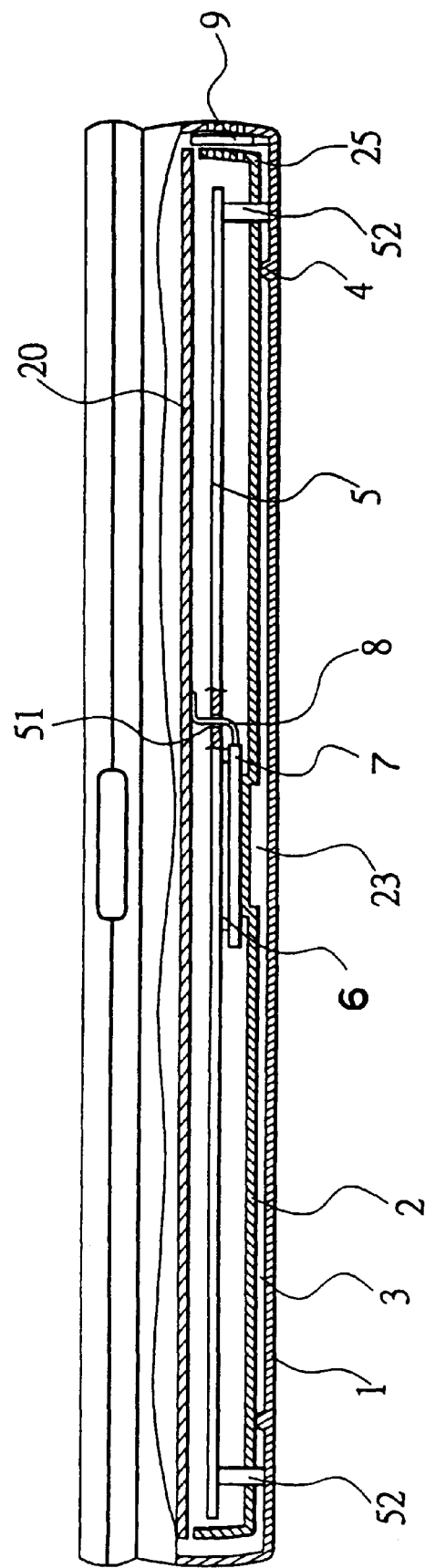
FIG. 4 is a sectional view of the fourth preferred embodiment of the present invention.
Figure 5:
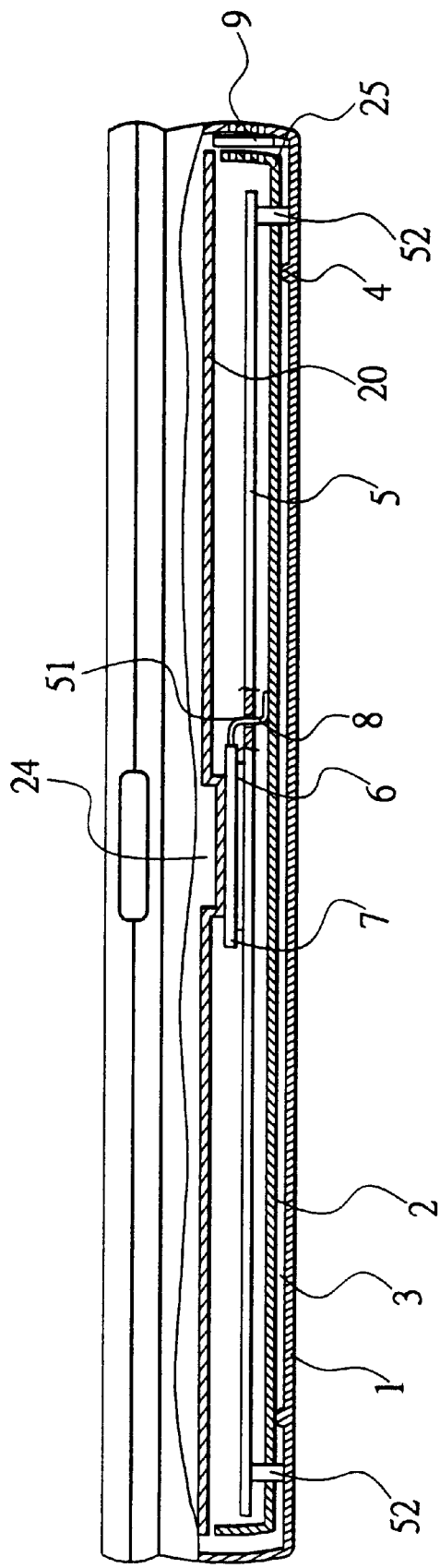
FIG. 5 is a sectional view of the fifth preferred embodiment of the present invention.

With reference to FIG. 1, a heat sink structure in a computer housing according to the present invention includes a thin plate 2 of metal mounted above an inner side of a light plastic housing 1, i.e. bottom side 1. The plate 2 extends along the bottom side of the housing having a substantially U-shaped cross section or is configured to be a "U" shape having a bottom side and a lateral side 25. A clearance 3 is defined between the plate 2 and the housing 1, in which a plurality of mounting elements 4 may be employed to mount the plate 2 at a higher position. The mounting elements 4 may be directly provided on the housing 1 or on the bottom side of the plate 2 at suitable positions. A main board 5 is disposed above the plate 2, and is supported by supporting elements 52. A heat sink element 7 of a central processing unit 6 on the main board 5 is connected to the plate 2 via at least one heat pipe 8 that extends downwardly from a hole 51 formed in the main board 5 to transfer the heat of the central processing unit 6 to the plate 2. Since the amount of heat transferred by one heat pipe 8 is limited, a plurality of heat pipes 8 can be provided as required to dissipate the heat in the housing 1 via the plate 2. In addition, a fan 9 is disposed in the housing 1 or one side thereof to lead out the hot air in the housing 1. The plate 2 is further formed with a plurality of air vents 21 to enhance air circulation (see FIG. 2) or provided with a plurality of ribs to form a corrugated surface 22 (see FIG. 3) to enhance heat dissipation. The plate 2 is preferably formed from metal of good heat conductivity, such as copper, aluminum. With reference to FIGS. 4 and 5, a top side of the main board 5, i.e. below a keyboard, is provided with a thin upper plate 20 of metal. In the two embodiments shown in FIGS. 4 and 5, the direction of arrangement of the main board 5 is different. In the embodiment shown in FIG. 4, the central processing unit 6 is oriented downwardly, whereas in the embodiment in FIG. 5 the central processing unit 6 is oriented upwardly. Hence, in FIG. 4, the plate 2 near the central processing unit 6 is formed with a recess 23 to abut against the heat sink element 7 on the central processing unit 6 to more quickly dissipate the heat. And in FIG. 5, the upper plate 20 near the central processing unit 6 is formed with a recess 24 to abut against the heat sink element 7 on the central processing unit 6 to achieve the same effect. Further, the arrangement of upper and lower plates metal can better prevent electromagnetic interference.

In the present invention, by providing a metal plate on an inner side of a portable computer housing to dissipate the heat, at least, it is not necessary to provide a fan on the central processing unit. By arranging a plurality of heat pipes on the central processing unit to transfer heat, a thin plate of a size substantially the same as that of the main board is enough to dissipate the heat. The heat dissipation area thus achieved is greater than the surface area of the heat sink element independently provided on the central processing unit. Due to the heat sink structure of the present invention, the entire heat dissipation space is increased. As other components in the computer housing also give out heat during operation, thin metal plates according to the present invention may be provided on the respective components to dissipate the heat generated thereby. The present invention also provides a fan to help dissipate heat quickly from the computer housing. Furthermore, as copper and aluminum plates are relatively inexpensive and the present invention is simple in construction and provides a good heat dissipation effect, the present invention is more economical compared to aluminum magnesium computer housings. In addition, the arrangement of the air vents and the corrugated surface in the present invention permits better heat circulation. Besides, the plate of the present invention does not much weight to the computer housing and is not space-occupying. The present invention can be adapted for use in computer housings of different models as long as the clearance between the plate and the computer housing is controlled. Lastly, the present invention can be used to dissipate the heat of all the components in the computer housing and can better prevent electromagnetic interference. Although the present invention has been illustrated and described with reference to the preferred embodiment thereof, it should be understood that it is in no way limited to the details of such embodiment but is capable of numerous modifications within the scope of the appended claims.

What is claimed is:

1. A heat sink structure adapted for use in a computer housing, comprising a thin plate of metal mounted on an inner side of a plastic computer housing, a clearance being confined between said plate and said computer housing, said plate being connected to a main board disposed above, said plate a heat sink element disposed on a central processing unit which is mounted on said main board having at least one heat pipe connected to said plate to dissipate heat in said computer housing via said plate.

2. A heat sink structure adapted for use in a computer housing as defined in claim 1, wherein said plate is formed from metal of good heat conductivity, such as copper or aluminum.

3. A heat sink structure adapted for use in a computer housing as defined in claim 1, wherein said plate is provided with a plurality of ribs to form a corrugated surface to achieve better heat dissipation.

4. A heat sink structure adapted for use in a computer housing as defined in claim 1, wherein said plate is formed with a plurality of air vents to enhance air circulation.

5. A heat sink structure adapted for use in a computer housing as defined in claim 1, wherein said computer housing has a fan provided on one side thereof to guide out hot air.

6. A heat sink structure adapted for use in a computer housing as defined in claim 1, wherein said main board further has a thin upper plate of metal provided thereon so that said main board is located between upper and lower plates of metal.

7. A heat sink structure adapted for use in a computer housing as defined in claim 6, wherein said upper plate is formed with a recess oriented towards a surface of said heat sink element of said central processing unit.

8. A heat sink structure adapted for use in a computer housing as defined in claim 1, wherein said plate has a generally U-shaped cross section.

9. A heat sink structure adapted for use in computer housing, comprising a thin plate of metal mounted on an inner side of a plastic computer housing, a clearance being confined between said plate and said computer housing, said thin plate being connected to a main board disposed above said plate, and a heat sink element abutting a central processing unit which is mounted to said main board, said heat sink element having at least one heat pipe connected to an upper plate to dissipate heat in said computer housing via said upper plate as well as said thin plate, wherein said thin plate is formed with a recess that lies against a surface of said heat sink element.

* * * * *